(12) United States Patent
Uto et al.

(10) Patent No.: US 11,383,498 B2
(45) Date of Patent: Jul. 12, 2022

(54) LAYERED FILM AND DISPLAY DEVICE

(71) Applicant: Toray Industries, Inc., Tokyo (JP)

(72) Inventors: Takayuki Uto, Otsu (JP); Wataru Gouda, Otsu (JP); Takahito Sakai, Otsu (JP); Hiroji Kojima, Shizuoka (JP); Yuji Matsuo, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 17/045,877

(22) PCT Filed: Apr. 5, 2019

(86) PCT No.: PCT/JP2019/015109
§ 371 (c)(1),
(2) Date: Oct. 7, 2020

(87) PCT Pub. No.: WO2019/198635
PCT Pub. Date: Oct. 17, 2019

(65) Prior Publication Data
US 2021/0138772 A1 May 13, 2021

(30) Foreign Application Priority Data
Apr. 10, 2018 (JP) .............................. JP2018-075167

(51) Int. Cl.
| | | |
|---|---|---|
| *B32B 7/023* | (2019.01) | |
| *B32B 27/08* | (2006.01) | |
| *B32B 27/36* | (2006.01) | |
| *G02B 5/30* | (2006.01) | |
| G02B 27/01 | (2006.01) | |

(52) U.S. Cl.
CPC .............. *B32B 27/08* (2013.01); *B32B 7/023* (2019.01); *B32B 27/36* (2013.01); *G02B 5/305* (2013.01); *B32B 2250/05* (2013.01); *B32B 2274/00* (2013.01); *B32B 2307/402* (2013.01); *B32B 2307/418* (2013.01); *B32B 2307/42* (2013.01); *C09K 2323/00* (2020.08); *C09K 2323/03* (2020.08); *C09K 2323/035* (2020.08); *G02B 27/01* (2013.01)

(58) Field of Classification Search
CPC ........... C09K 2323/00; C09K 2323/03; C09K 2323/035; G02B 5/305; G02B 5/3066; G02B 2027/0194; G02B 27/0101; B32B 27/08; B32B 27/36; B32B 7/023; B32B 2250/05; B32B 2307/418; B32B 2307/42
USPC .......................... 428/1.3, 1.33, 1.1; 349/117
See application file for complete search history.

(56) References Cited

U.S. PATENT DOCUMENTS

| | | | |
|---|---|---|---|
| 5,882,774 A | 3/1999 | Jonza et al. | |
| 2004/0126549 A1* | 7/2004 | Ruff ...................... | B32B 27/08 |
| | | | 428/212 |
| 2005/0270655 A1* | 12/2005 | Weber .............. | B32B 17/10458 |
| | | | 359/630 |

FOREIGN PATENT DOCUMENTS

| | | |
|---|---|---|
| JP | 10511322 A | 11/1998 |
| JP | 2007307893 A | 11/2007 |
| JP | 2008132611 A | 6/2008 |
| JP | 2015169769 A | 9/2015 |
| JP | 2017124621 A | 7/2017 |
| JP | 2017206012 A | 11/2017 |
| WO | 9736195 A1 | 10/1997 |
| WO | 2005017600 A1 | 2/2005 |

OTHER PUBLICATIONS

International Search Report and Written Opinion for International Application No. PCT/JP2019/015109, dated Jul. 2, 2019, 4 pages.

\* cited by examiner

*Primary Examiner* — Ruiyun Zhang
(74) *Attorney, Agent, or Firm* — RatnerPrestia

(57) ABSTRACT

The present invention provides a laminate film and a display member including the laminate film, which are excellent in visibility of external information such as scenery and displayability of information from a projection member, and are also excellent in color tone reproducibility. The laminate film includes a laminate of 50 or more alternately arranged layers of a plurality of different thermoplastic resins, the laminate film having a transmittance of light incident perpendicularly to a film surface of 50% or more, the laminate film satisfying a relationship of $R20 \leq R40 < R70$, wherein $R20$, $R40$, and $R70$ are reflectances of a P-wave incident at angles of 20°, 40°, and 70°, respectively, to the normal to the film surface, the reflectance of R70 being 30% or more, reflected light of the P-wave incident at 70° to the normal to the film surface having a saturation of 20 or less.

17 Claims, No Drawings

LAYERED FILM AND DISPLAY DEVICE

CROSS REFERENCE TO RELATED APPLICATIONS

This is the U.S. National Phase application of PCT/JP2019/015109, filed Apr. 5, 2019, which claims priority to Japanese Patent Application No. 2018-075167, filed Apr. 10, 2018, the disclosures of each of these applications being incorporated herein by reference in their entireties for all purposes.

FIELD OF THE INVENTION

The present invention relates to a laminate film and a display device including the laminate film.

BACKGROUND OF THE INVENTION

Head-up displays (HUDs) are known as a means for displaying information directly in the human visual field. For example, during driving of an automobile, the HUD directly displays, on the windshield in the vehicle, information such as the speed of measuring instruments as a virtual image. Therefore, the HUDs have characteristics that they enable a driver to drive without changing the visual field and lead to prevention of accidents. Usually, light emitted from a projector such as a small liquid crystal projector is transmitted and reflected by a display unit made of a transparent substrate and including a half mirror material. A viewer acquires the information displayed on the display unit and simultaneously acquires external information such as the outside scenery through the display unit.

As a display device based on a similar technique, head mounted displays used in AR (Augmented Reality) can be mentioned. The head mounted display (HMD) used for AR applications is used to visually recognize the external information through a glass-shaped display device worn on the head, and to transmit the information from a projector provided on the side of the display device and display the information on the glasses.

As for the display device used in the HUDs and HMDs, from the viewpoint of safety and visibility, for example, Patent Document 1 discloses a head-up display including a film having polarized reflection properties to reflect only the polarized light radiated from a liquid crystal projector. The head-up display, however, has a problem that the film having polarized reflection properties used in the display remarkably lowers the visibility as in polarized sunglasses, since light from the outside, such as light of scenery, is unpolarized in many cases.

PATENT DOCUMENTS

Patent Document 1: International Publication No. 2005/17600
Patent Document 2: International Publication No. 1997/36195

SUMMARY OF THE INVENTION

As a means for achieving both the visibility of information such as outside scenery and displayability of information that is obliquely projected, it is conceivable to use a multilayer laminate having controlled refractive indices (for example, Patent Document 2). Indeed, the multilayer laminate disclosed in Patent Document 2 used in a HUD or a HMD improves the permeability in the front direction and the visibility of external information such as scenery. The multilayer laminate, however, has a problem that it may be colored and may change the color tone due to the information from a projection member.

Under such circumstances, the present invention is intended to solve the above-mentioned problems, and it is an object of the present invention to provide a laminate film and a display device including the laminate film, which are excellent in visibility of external information such as scenery and displayability of information from a projection member, and are also excellent in color tone reproducibility.

The present invention is intended to solve the above-mentioned problems, and provides a laminate film including a laminate of 50 or more layers of a plurality of different thermoplastic resins laminated in a thickness direction of the laminate film, the laminate film having a transmittance of light incident perpendicularly to a film surface of 50% or more, the laminate film satisfying a relationship of R20 R40<R70, wherein R20, R40, and R70 are reflectances (%) of a P-wave incident at angles of 20°, 40°, and 70°, respectively, to the normal to the film surface, the reflectance of R70 being 30% or more, reflected light of the P-wave incident at the angle of 70° to the normal to the film surface having a saturation of 20 or less.

According to the present invention, it is possible to provide a display device having visibility of external information and displayability of information from a projection member when used as a display unit of a head-up display or a head mounted display.

DETAILED DESCRIPTION OF EMBODIMENTS OF THE INVENTION

Embodiments of the present invention will be described below, but the present invention is not construed as being limited to the embodiments including the following examples. Various modifications can be of course made without departing from the gist of the invention as long as the object of the invention can be achieved. Further, for the purpose of simplifying the description, some description is made by taking an example of a laminate film in which two different thermoplastic resins are alternately laminated, but the invention should be understood similarly even when three or more thermoplastic resins are used.

The laminate film according to embodiments of the present invention is required to include a laminate of 50 or more layers of a plurality of different thermoplastic resins. The laminate film of the present invention preferably includes a laminate of 50 or more alternately laminated layers of a plurality of different thermoplastic resins. Herein, the wording "the thermoplastic resins are different" means that the thermoplastic resins have refractive indices that are different by 0.01 or more in any of two orthogonal directions arbitrarily selected in the plane of the film and a direction perpendicular to the plane.

Herein, the wording "alternately laminated" means that the layers of different thermoplastic resins are laminated in a regular arrangement in the thickness direction. When there are a thermoplastic resin A and a thermoplastic resin B, and layers of the thermoplastic resins are expressed as a layer A and a layer B, respectively, an alternately laminated laminate is a laminate in which the layers are sequentially laminated as in A(BA)n (n is a natural number). When there are a thermoplastic resin A, a thermoplastic resin B, and a thermoplastic resin C, and layers of the thermoplastic resins are expressed as a layer A, a layer B, and a layer C, respectively, the arrangement is not particularly limited as long as the laminate includes all the layers. One example of the alternately laminated laminate is a laminate in which the layers are sequentially laminated as in C(BA)nC, C(ABC)n, and C(ACBC)n.

Alternately laminating resins having different optical properties in this manner makes it possible to exhibit interference reflection, by which it is possible to reflect light having a designed wavelength owing to the relationship between the difference in refractive index among the layers and the layer thicknesses.

When the number of layers to be laminated is 49 or less, high reflectance is not obtained in a band in which high reflectance is desired. Further, owing to the interference reflection described above, the larger the number of layers is, the wider the wavelength band is in which a high reflectance for light can be achieved, and a laminate film that reflects light in a band in which high reflectance is desired can be obtained. The number of layers is preferably 400 or more, more preferably 800 or more. In addition, although there is no upper limit on the number of layers, realistically speaking, a practical number of layers is about 10,000. This is because the larger the number of layers is, the more the manufacturing cost increases due to an increase in the size of the manufacturing apparatus, and the larger the film thickness is, so that the handling property is deteriorated.

The laminate film according to embodiments of the present invention is required to have a transmittance of light incident perpendicularly to a film surface (that is, incident at an angle of 0° to the normal to the film surface) of 50% or more. Herein, the wording "the transmittance of light incident perpendicularly to the film surface is 50% or more" specifically means that the average transmittance of light through the film in a wavelength range of 450 to 650 nm is 50% or more. Due to the high transmittance of light in the visible light region in a wavelength range of 450 to 650 nm, the film has excellent permeability to external information such as scenery when incorporated as a display substrate into a HUD or a HMD. The transmittance of light is preferably 70% or more, more preferably 80% or more, still more preferably 90% or more. When the transmittance is 90% or more, the laminate film can be used without any burden on the user because glasses including the laminate film have transparency comparable to that of normal glasses. Such a laminate film is obtained by providing a small difference in refractive index between the two thermoplastic resins in a direction parallel to the film surface in the final product. It becomes easy to set the transmittance to 50% or more when the difference in refractive index in the direction parallel to the film surface is 0.06 or less, 70% or more when the difference in refractive index is 0.04 or less, 80% or more when the difference in refractive index is 0.02 or less, and 90% or more when the difference in refractive index is 0.01 or less.

The laminate film of the present invention preferably has a retardation of 2000 nm or less. In order to increase the transmittance of light incident perpendicularly to the film surface, it is required to provide a small difference in refractive index between the two thermoplastic resins in a direction parallel to the film surface in the final product. When there is an anisotropy in the orientation state between the film width direction and the film flow direction that is orthogonal to the width direction, and the resins are selected so that the difference in refractive index in either of the directions may be small, the refractive index in the direction orthogonal to the width direction would be large. As a result, it may be difficult to achieve transparency in the direction perpendicular to the film surface. Therefore, the retardation, which is a parameter relating to the anisotropy in the orientation state, is set to 2000 nm or less, so that the anisotropy in the orientation state in the plane of the film can be reduced, and the transmittance of light incident perpendicularly to the film surface can be easily set to 70% or more. The retardation is preferably 1000 nm or less, more preferably 500 nm or less. As the retardation is smaller, it becomes easier to provide a small difference in refractive index between the two thermoplastic resins in the direction parallel to the film surface in either of the film width direction and the film flow direction orthogonal to the width direction, and it is possible to increase the transmittance of light incident perpendicularly to the film surface. In addition, when the laminate film receives polarized light such as reflected light from a liquid crystal display or a building, and the laminate film has large retardation, the laminate film may be colored due to the retardation. Therefore, it is possible to suppress the coloring by setting the retardation to 500 nm or less.

The laminate film according to embodiments of the present invention is required to satisfy a relationship of $R20 \leq R40 < R70$, wherein R20, R40, and R70 are reflectances (%) of a P-wave incident at angles of 20°, 40°, and 70°, respectively, to the normal to the film surface. Herein, the reflectance is the average reflectance in a wavelength range of 450 to 650 nm. In the case of general transparent substrates such as glass and a transparent film, as the incident angle is gradually increased from 20° to the normal to the film surface, the reflectance of the P-wave, which is one of polarized light, decreases, and the reflectance reaches zero at an angle called the Brewster's angle. Therefore, when information is projected on the transparent substrate at an incident angle close to the Brewster's angle, the transparent substrate has poor displayability due to the low reflectance. Therefore, when a film satisfies a relationship of $R20 \leq R40 < R70$, wherein R20, R40, and R70 are reflectances of a P-wave incident at angles of 20°, 40°, and 70°, respectively, to the normal to the film surface, since there is no angle corresponding to the Brewster's angle, it becomes possible to clearly display the information projected on the film surface obliquely. It is also required that R70 be 30% or more. When the reflectance at an incident angle of 70° is 30% or more, it is possible to obtain a highly clear display particularly in the case of a system in which information is projected from the side surface as in HMDs. The reflectance at an incident angle of 70° is preferably 50%. The higher the reflectance is, the easier it is to provide a display device excellent in displayability. Such a laminate film is obtained by providing a large difference in refractive index between the two thermoplastic resins in a direction perpendicular to the film surface in the final product. It becomes easy to set the reflectance to 30% or more when the difference in refractive index in the direction perpendicular to the film surface is 0.08 or more, and 50% or more when the difference in refractive index is 0.12 or more.

In order to provide such a laminate film, it is preferable that the laminate film have one melting point and have an enthalpy of fusion of 20 J/g or more. Herein, the melting point and the enthalpy of fusion are those measured by a measurement method described later using differential scanning calorimetry (DSC). In order to provide a small difference in refractive index in the direction parallel to the film surface and a large difference in refractive index in the direction perpendicular to the film surface, it is important that one of the thermoplastic resins be strongly oriented in the direction parallel to the film surface (that is, the refractive index in the direction parallel to the film surface is large and the refractive index in the direction perpendicular to the film surface is small) while the other thermoplastic resin maintain the isotropy (that is, the refractive indices in the direction parallel to the film surface and in the direction perpendicular to the film surface are the same). The fact that the laminate film has one melting point means that only one thermoplastic resin out of the plurality of different thermoplastic resins is oriented and crystallized, and the other thermoplastic resins are amorphous and are not oriented. This means that it is easy to provide a large difference in refractive index in the direction perpendicular to the film surface when the resins are selected so as to provide a small difference in refractive index in the direction parallel to the film surface. In addition, the fact that the laminate film has an enthalpy of fusion of 20 J/g or more means that the resin having a melting point is progressively oriented and crystallized, and it is easy to provide a large difference in refractive index in the direction perpendicular to the film surface.

It is more preferable that the outermost layer that constitutes the laminate film have an in-plane average refractive index of 1.61 or more. A large average refractive index in the in-plane direction of the film makes it possible to easily provide a large difference in refractive index in the direction perpendicular to the film surface. The in-plane average refractive index is more preferably 1.63 or more.

In a preferred aspect of the present invention, it is preferable that the difference in glass transition temperature between the thermoplastic resins that constitute the laminate film be 20° C. or less. When there are a plurality of glass transition temperatures, higher glass transition temperatures at two points are required to be 20° C. or less. The laminate film preferably has a glass transition temperature of 90° C. or less. Further, when there are a plurality of glass transition temperatures, it is preferable that all the glass transition temperatures be 90° C. or less. In general, when a resin is progressively oriented and crystallized, the resin has a larger refractive index in the direction parallel to the film surface. Meanwhile, an amorphous resin is required to contain an aromatic compound such as a benzene ring and a naphthalene ring in order to have a high refractive index. Therefore, in order to equalize the difference in refractive index between different thermoplastic resins in the laminate film in the direction parallel to the film surface, it is required to laminate an oriented crystalline resin having a low aromatic compound content and an amorphous resin having a high aromatic compound content. Since the glass transition temperature tends to be higher as the aromatic compound content is higher, in the above-mentioned combination of the resins, the oriented crystalline resin tends to have a lower glass transition temperature and the amorphous resin tends to have a higher glass transition temperature. In such a case, depending on the selection of the resins, it may be difficult to stretch the amorphous resin at a film stretching temperature optimal for promoting the orientation and crystallization, and a film having desired reflection performance may not be obtained. Therefore, the difference in glass transition temperature between the thermoplastic resins that constitute the laminate film is set to 20° C. or less, so that it is possible to sufficiently orient the resin to be oriented and to set R70 to 30% or more. Furthermore, setting the glass transition temperature to 90° C. or less makes it easy to form a film of an oriented crystalline thermoplastic resin and an amorphous resin at a film stretching temperature at which the orientation and crystallization are promoted. Therefore, it becomes easy to achieve both the transparency in the direction perpendicular to the film surface and the excellent reflection performance in the direction of 70° to the film surface. The difference in glass transition temperature between a plurality of different thermoplastic resins is more preferably 15° C., still more preferably 5° C. or less. As the difference in glass transition temperature is smaller, it is easier to adjust the film stretching conditions and to improve the optical performance. Such a laminate film can be achieved by selecting the resins as described later.

In the laminate film according to an embodiment of the present invention, it is required that the reflected light of the P-wave incident at the angle of 70° to the normal to the film surface have a saturation of 20 or less. Herein, the "saturation" means a saturation C' value that is calculated using the reflection spectrum of the P-wave measured with a spectrophotometer at a certain incident angle, the spectral distribution of a C light source, and the color-matching function of the XYZ system based on the XYZ values under the C light source, and the XYZ values. Setting the saturation to 20 or less makes it possible to provide a display member that suffers from little coloring and that is excellent in color recognition of external information such as scenery as well as in color recognition of display from a projection member when used as a transparent substrate of a HUD or a HMD. The saturation is more preferably 10 or less, still more preferably 5 or less. The smaller the saturation is, the lower the degree of coloring of the laminate film is. A laminate film that provides a saturation of 5 or less, when used as a transparent substrate of a HUD or a HMD, can be used without any discomfort in the color recognition before and after being worn, and can express the information to be displayed with accurate colors. In order to provide such a laminate film, it is also preferable that the deviation of the transmittance of the P-wave incident at the angle of 70° to the normal to the film surface in a wavelength range of 450 to 650 nm be 10% or less. Herein, the wording "deviation of the transmittance" is the deviation of the transmittance data at 201 points sampled at a wavelength interval of 1 nm in the wavelength range of 450 to 650 nm. As described above, since the deviation of the transmittance in the wavelength range of 450 to 650 nm is 10% or less, it is possible to evenly transmit the light corresponding to RGB, so that the coloring of the transmitted light can be suppressed, and the saturation of 20 or less can be easily achieved. The deviation of the transmittance of the P-wave incident at the angle of 70° in a wavelength range of 450 to 650 nm is more preferably 5% or less. In this case, it is possible to achieve a saturation of 5 or less, and thus the laminate film is excellent in visibility of external information such as scenery and display from a projection member when used as a transparent substrate of a HUD or a HMD. Similarly, it is also preferable that the difference between the maximum value and the minimum value of the reflectance of the P-wave incident at the angle of 70° to the normal to the film surface in a wavelength range of 450 to 650 nm be less than 40%. The difference between the maximum value and the minimum value is more preferably less than 20%, still more preferably less than 10%. When the deviation of the transmittance of the P-wave in the wavelength range of 450 to 650 nm is small, it will be easier to provide a laminate film that provides a low saturation. Additionally, when the difference between the maximum value and the minimum value is small, the coloring caused by local reflection can also be suppressed, and it will be easier to reduce the saturation.

The thermoplastic resins used in the present invention can be chain polyolefins such as polyethylene, polypropylene, poly(4-methylpentene-1), and polyacetal, alicyclic polyolefins that are produced from norbornene by ring-opening metathesis polymerization, addition polymerization, or addition copolymerization with other olefins, biodegradable polymers such as polylactic acid and polybutyl succinate, polyamides such as nylon 6, nylon 11, nylon 12, and nylon 66, aramid, polymethyl methacrylate, polyvinyl chloride, polyvinylidene chloride, polyvinyl alcohol, polyvinyl butyral, an ethylene-vinyl acetate copolymer, polyacetal, polyglycolic acid, polystyrene, styrene-copolymerized polymethyl methacrylate, polyesters such as polycarbonate, polypropylene terephthalate, polyethylene terephthalate, polybutylene terephthalate, and polyethylene-2,6-naphthalate, polyethersulfone, polyetheretherketone, modified polyphenylene ether, polyphenylene sulfide, polyetherimide, polyimide, polyarylate, a tetrafluoroethylene resin, a trifluoroethylene resin, a trifluorochloroethylene resin, a tetrafluoroethylene-hexafluoropropylene copolymer, and polyvinylidene fluoride. Of these, a polyester is particularly preferably used from the viewpoint of strength, heat resistance, transparency, and versatility. These compounds may be a copolymer or a mixture of two or more resins.

The polyester is preferably a polyester obtained by polymerization from a monomer mainly containing an aromatic dicarboxylic acid or an aliphatic dicarboxylic acid and a diol. Examples of the aromatic dicarboxylic acid include terephthalic acid, isophthalic acid, phthalic acid, 1,4-naphthalenedicarboxylic acid, 1,5-naphthalenedicarboxylic acid, 2,6-naphthalenedicarboxylic acid, 4,4'-diphenyldicarboxylic acid, 4,4'-diphenylether dicarboxylic acid, and 4,4'-diphenylsulfone dicarboxylic acid. Examples of the aliphatic dicarboxylic acid include adipic acid, suberic acid, sebacic acid, dimer acid, dodecanedioic acid, cyclohexanedicarboxylic acid, and ester derivatives thereof. Of these, terephthalic acid and 2,6-naphthalenedicarboxylic acid that exhibit a high refractive index are preferable. These acid components may be used alone or in combination of two or more. Furthermore, oxyacids such as hydroxybenzoic acid may be partially copolymerized.

Examples of the diol component include ethylene glycol, 1,2-propanediol, 1,3-propanediol, neopentyl glycol, 1,3-butanediol, 1,4-butanediol, 1,5-pentanediol, 1,6-hexanediol, 1,2-cyclohexanedimethanol, 1,3-cyclohexanedimethanol, 1,4-cyclohexanedimethanol, diethylene glycol, triethylene glycol, polyalkylene glycol, 2,2-bis(4-hydroxyethoxyphenyl)propane, isosorbate, and spiroglycol. Of these, ethylene glycol is preferably used. These diol components may be used alone or in combination of two or more.

The thermoplastic resins of the present invention selected from the above-mentioned polyesters are, for example, preferably polyethylene terephthalate or a polymer thereof, polyethylene naphthalate or a copolymer thereof, polybutylene terephthalate or a copolymer thereof, polybutylene naphthalate or a copolymer thereof, polyhexamethylene terephthalate or a copolymer thereof, or polyhexamethylene naphthalate or a copolymer thereof.

As for a preferable combination of the thermoplastic resins used in the laminate film of the present invention, it is first preferable that the absolute value of the difference in SP value among the thermoplastic resins be 1.0 or less. When the absolute value of the difference in SP value is 1.0 or less, delamination hardly occurs. It is more preferable that polymers having different optical properties and used in combination have the same basic skeleton. Herein, the "basic skeleton" refers to a repeating unit that constitutes a resin. For example, when polyethylene terephthalate is used as one of thermoplastic resins, another thermoplastic resin contained is preferably ethylene terephthalate that has the same basic skeleton as that of polyethylene terephthalate from the viewpoint that ethylene terephthalate is capable of easily realizing a highly precise lamination structure. When the thermoplastic resins having different optical properties are resins including the same basic skeleton, the precision of lamination is high, and delamination at the lamination interface is less likely to occur.

In particular, in the laminate film of the present invention, it is preferable that of the layers that are alternately laminated, the resin that constitutes one of the layers (layer A) contain a crystalline polyester, and the resin that constitutes the other layer (layer B) be an amorphous polyester. Herein, the "amorphous resin" refers to a resin having a heat of crystal fusion (ΔHm) of 5 J/g or less, wherein the heat of crystal fusion is determined according to JIS K7122 (1999) by heating the resin from 25° C. to 300° C. at a heating rate of 20° C./min (1st RUN), holding the resin in the same state for 5 minutes, then rapidly cooling the resin to a temperature of 25° C. or less, again heating the resin from room temperature to a temperature of 300° C. at a heating rate of 20° C./min, and determining the heat of crystal fusion from the peak area of the melting peak in the differential scanning calorimetry chart of the 2nd RUN. It is more preferable that the amorphous resin be a resin that does not exhibit a peak corresponding to crystal fusion. When a crystalline thermoplastic resin is used as one of the thermoplastic resins and an amorphous thermoplastic resin is used as the other thermoplastic resin, a laminate film containing the resins has only one melting point.

The laminate film of the present invention preferably contains, in an amorphous thermoplastic resin, a polycyclic aromatic compound as a copolymerization component. Incorporation of a polycyclic aromatic compound such as naphthalene or anthracene may easily provide a high refractive index. It is more preferable that the laminate film contain a copolymer containing three or more dicarboxylic acids and three or more diols. In the case of a thermoplastic resin containing one dicarboxylic acid and one diol, when the laminate film is stretched, orientation and crystallization may be promoted due to high symmetry of the resin, and it may be impossible to maintain the amorphous state. Meanwhile, incorporating a copolymer containing three or more dicarboxylic acids and three or more diols makes it possible to maintain the amorphous state without the progress of orientation and crystallization when the laminate film is stretched.

In addition, the laminate film of the present invention preferably includes a structure derived from an alkylene glycol having a number average molecular weight of 200 or more in any of the layers that constitute the laminate film. As described above, the laminate film is required to contain a large amount of aromatic compounds in order to have a high refractive index. When the laminate film further includes a structure derived from an alkylene glycol, it is easy to efficiently lower the glass transition temperature while maintaining the refractive index, and as a result, a laminate film in which each layer that constitutes the laminate film has an in-plane average refractive index of 1.61 or more, and that has a glass transition temperature of 90° C. or less can be easily obtained. It is particularly preferable that the thermoplastic resin that constitutes the layer B be amorphous and include a structure derived from an alkylene glycol having a number average molecular weight of 200 or more, and it is still more preferable that the layer containing an amorphous thermoplastic resin be composed of only an amorphous thermoplastic resin including a structure derived from an alkylene glycol. Use of a small amount of the thermoplastic resin including a structure derived from an alkylene glycol mixed with a different amorphous resin makes it possible to efficiently lower the glass transition temperature while maintaining the refractive index of the amorphous resin. Furthermore, it is preferable to use a copolymer including a structure derived from an alkylene glycol as a thermoplastic resin itself, because the thermoplastic resin including a structure derived from an alkylene glycol is prevented from precipitating on the film surface even when the film is processed under high temperature conditions. Examples of the alkylene glycol include polyethylene glycol, polytrimethylene glycol, and polytetramethylene glycol. The molecular weight of the alkylene glycol is more preferably 200 or more, still more preferably 300 or more and 2000 or less. If the molecular weight of the alkylene glycol is less than 200, during the synthesis of the thermoplastic resin, the alkylene glycol may not be sufficiently incorporated into the polymer due to its high volatility, and as a result, the effect of lowering the glass transition temperature may not be sufficiently obtained. Conversely, if the molecular weight of the alkylene glycol is more than 2000, the reactivity during the production of the thermoplastic resin may lower, and the alkylene glycol may be unsuitable for film production.

In the laminate film of the present invention, it is more preferable that the thermoplastic resin that constitutes the layer B include a structure derived from two or more aromatic dicarboxylic acids and two or more alkyl diols, and include at least a structure derived from an alkylene glycol having a number average molecular weight of 200 or more. The thermoplastic resin B used in the laminate film according to an embodiment of the present invention is required to achieve a high refractive index comparable to that of an oriented crystalline thermoplastic resin in an amorphous state, and to have a glass transition temperature at which the thermoplastic resin B is co-stretchable with a crystalline thermoplastic resin. It is difficult to satisfy all these requirements with a single dicarboxylic acid or a single alkylene diol. Therefore, incorporation of two or more aromatic dicarboxylic acids and two or more alkyl diols can provide a high refractive index owing to the aromatic dicarboxylic acids and a low glass transition temperature owing to the plurality of alkyl diols, and incorporation of four or more dicarboxylic acids and diols in total can provide an amorphous resin.

Further, the thermoplastic resin may contain, to the extent that the properties of the resin do not deteriorate, various additives such as antioxidants, heat stabilizers, weather stabilizers, ultraviolet absorbers, organic lubricants, pigments, dyes, organic or inorganic fine particles, fillers, antistatic agents, and nucleating agents.

Then, a preferable method for producing the laminate film of the present invention will be described below by taking a laminate film containing the thermoplastic resins A and B as an example. Of course, the present invention should not be construed as being limited to such an example. In addition, the lamination structure of the laminate film used in the present invention can be easily realized by a method similar to that described in paragraphs [0039] to [0059] of International Publication No. 2007/020861.

The thermoplastic resins are prepared in the form of pellets. The pellets are dried in hot air or under vacuum as necessary, and then fed to separate extruders. When the thermoplastic resins contain an ultraviolet absorber, pellets containing an ultraviolet absorber are prepared in advance by kneading the ultraviolet absorber into the thermoplastic resins, or the thermoplastic resins and an ultraviolet absorber are kneaded in an extruder. The resins melted in the extruder by heating to a temperature equal to or higher than the melting point are made uniform as to the extrusion amount by a gear pump or the like, and are freed of any foreign matters or denatured resin through a filter or the like. These resins are molded into a desired shape by a die and then discharged. Then, a multilayer laminated sheet discharged from the die is extruded onto a cooling body such as a casting drum, and cooled and solidified into a cast film. In this process, it is preferable to bring the sheet into close contact with the cooling body such as a casting drum by an electrostatic force using a wire-like, tape-like, needle-like, or knife-like electrode, and to rapidly cool and solidify the sheet. It is also preferable to employ a method of bringing the sheet into close contact with the cooling body such as a casting drum by blowing air from a slit-like, spot-like, or planar device, and rapidly cooling and solidifying the sheet, or bringing the sheet into close contact with the cooling body using a nip roll, and rapidly cooling and solidifying the sheet.

A plurality of resins including the thermoplastic resin used in the layer A and the thermoplastic resin B different from the thermoplastic resin A are sent out from different flow paths using two or more extruders, and sent into a multilayer laminating apparatus. Examples of usable multilayer laminating apparatuses include a multi-manifold die, a feed block, and a static mixer. In particular, in order to efficiently obtain the configuration of the present invention, a feed block having 50 or more fine slits is preferably used. Since the apparatus is not extremely large, use of such a feed block produces little foreign matters by thermal deterioration, and enables highly precise lamination even when an extremely large number of layers are laminated. Moreover, the precision of lamination in the width direction is also significantly improved as compared with conventional techniques. Further, since the apparatus is capable of adjusting the thickness of each layer by the shape (length and width) of the slit, an arbitrary layer thickness can be achieved.

The molten multilayer laminate formed to have a desired layer structure as described above is led to a die, and a cast film is obtained similarly to the above.

The cast film thus obtained is preferably biaxially stretched. Herein, "biaxial stretching" refers to stretching in the longitudinal direction and the width direction. Stretching may be performed sequentially in two directions or simultaneously in two directions. Further, the cast film may be re-stretched in the longitudinal direction and/or the width direction.

First, the case of sequential biaxial stretching will be described. Herein, the wording "stretching in the longitudinal direction" refers to stretching for imparting molecular orientation in the longitudinal direction to the film, and is usually performed by a difference in the peripheral speed of rolls. The stretching in the longitudinal direction may be performed in one stage, or in a plurality of stages using a plurality of pairs of rolls. Although the draw ratio varies depending on the type of the resin, it is usually preferably 2 to 15. When polyethylene terephthalate is used in any of the resins that constitute the laminate film, the draw ratio is particularly preferably 2 to 7. The stretching temperature is preferably in the range of (the glass transition temperature of the resin that constitutes the laminate film) to (the glass transition temperature+100° C.)

The uniaxially stretched film thus obtained is subjected to a surface treatment such as a corona treatment, a flame treatment, or a plasma treatment as necessary, and then functions such as slipperiness, easy adhesion, and antistatic properties may be imparted to the film by in-line coating.

The subsequent "stretching in the width direction" refers to stretching for imparting orientation in the width direction to the film, and is usually performed by conveying the film using a tenter with both ends of the film being held with clips. Although the draw ratio varies depending on the type of the resin, it is usually preferably 2 to 15. When polyethylene terephthalate is used in any of the resins that constitute the laminate film, the draw ratio is particularly preferably 2 to 7. In particular, in the laminate film of the present invention, the transverse draw ratio is preferably 4 or more. Increasing the transverse draw ratio is effective for increasing the uniformity of the reflection properties. The stretching temperature is preferably in the range of (the glass transition temperature of the resin that constitutes the laminate film) to (the glass transition temperature+120° C.)

Particularly in the laminate film of the present invention, in order to improve the uniformity of retardation in the film width direction, it is also preferable to employ a method of gradually increasing the stretching temperature from a low temperature to a high temperature during stretching in the film width direction, or a method of stretching the film at a high draw ratio and then at a low draw ratio during stretching in the film width direction. One of the causes of the reduction in the uniformity of retardation in the film width direction is often the stretching stress acting in the film flow direction during the width direction stretching. Employing the above-mentioned method can reduce the stress generated in the film flow direction during stretching in the film width direction to relatively increase the stress in the film width direction, and therefore, it is possible to achieve uniformity of retardation in the film width direction.

The film biaxially stretched as described above is preferably subjected to a heat treatment for imparting planarity and dimensional stability in the tenter at a temperature equal to or higher than the stretching temperature and equal to or lower than the melting point. The heat treatment improves the dimensional stability of the film to be molded. After being heat-treated in this manner, the film is gradually cooled down uniformly, and then cooled to room temperature and wound up. A relaxation treatment or the like may be combined as necessary during the gradual cooling from the heat treatment.

Particularly in the laminate film of the present invention, in order to make the retardation in the film width direction uniform, it is also preferable to stretch the film in the film width direction, then once cool the film to a temperature equal to or lower than the glass transition temperature, and then heat-treat the film. In this case, cooling the film once to a temperature equal to or lower than the glass transition temperature makes it possible to reduce the stretching stress in the film flow direction during the stretching step in the film width direction, and as a result, the uniformity of retardation in the film width direction can be improved.

As for the laminate film of the present invention, it is also preferable to gradually raise the temperature during the heat treatment. As for T1 that is the temperature at the end of stretching in the film width direction, T2 that is the temperature at the start of the heat treatment, and T3 that is the maximum temperature in the heat treatment step, it is more preferable that T2 be (T1+10° C.) or more and (T3−10° C.) or less, and it is still more preferable that T2 be in the range of (T1+T3)/2±10° C. Gradually increasing the heat treatment temperature in this manner also makes it possible to reduce the stretching stress in the film flow direction during the stretching step in the film width direction, and as a result, the uniformity of retardation in the film width direction can be improved.

In addition, as for the laminate film of the present invention, it is preferable to stretch, also in the heat treatment step, the film in the film width direction at a ratio of 1.01 or more and 1.2 or less based on the film width after the end of the stretching step in the film width direction. In the heat treatment step, almost no stress is generated in the longitudinal direction of the film, so that the uniformity of retardation in the width direction can be improved. Meanwhile, if the draw ratio in the film width direction in the heat treatment step is larger than 1.2, the film may suffer from thickness unevenness or tends to have a large retardation, and the film may be unsuitable for HUDs and HMDs.

Then, the case of simultaneous biaxial stretching will be described. In the case of simultaneous biaxial stretching, the obtained cast film is subjected to a surface treatment such as a corona treatment, a flame treatment, or a plasma treatment as necessary, and then functions such as slipperiness, easy adhesion, and antistatic properties may be imparted to the film by in-line coating.

Then, the cast film is led to a simultaneous biaxial tenter, conveyed with both ends of the film being held with clips, and stretched in the longitudinal direction and the width direction simultaneously and/or in stages. Examples of a simultaneous biaxial stretching machine include those of a pantograph type, a screw type, a drive motor type, and a linear motor type. A simultaneous biaxial stretching machine of a drive motor type or a linear motor type is preferable because the machine is capable of changing the draw ratio arbitrarily and capable of performing the relaxation treatment at any place. Although the draw ratio varies depending on the type of the resin, it is usually preferably 6 to 50 in area ratio. When polyethylene terephthalate is used in any of the resins that constitute the laminate film, the draw ratio is particularly preferably 8 to 30 in area ratio. In particular, in the case of simultaneous biaxial stretching, it is preferable to make the draw ratios in the longitudinal direction and the width direction the same and to make the stretching speeds in the longitudinal direction and the width direction substantially equal in order to reduce the in-plane orientation difference. The stretching temperature is preferably in the range of (the glass transition temperature of the resin that constitutes the laminate film) to (the glass transition temperature+120° C.)

The film biaxially stretched as described above is preferably subsequently subjected to a heat treatment for imparting planarity and dimensional stability in the tenter at a temperature equal to or higher than the stretching temperature and equal to or lower than the melting point. In the heat treatment, it is preferable to perform a relaxation treatment in the longitudinal direction instantaneously immediately before and/or immediately after the film enters the heat treatment zone in order to reduce the distribution of the main orientation axis in the width direction. After being heat-treated in this manner, the film is gradually cooled down uniformly, and then cooled to room temperature and wound up. A relaxation treatment in the longitudinal direction and/or the width direction may be performed as necessary during the gradual cooling from the heat treatment. The relaxation treatment is performed in the longitudinal direction instantaneously immediately before and/or immediately after the film enters the heat treatment zone.

The laminate film obtained as described above is suitable for a display device including a light source that emits light incident on the laminate film at an angle of 40° or more to the normal to the film surface. Since the laminate film satisfies a relationship of R20≤R40<R70, wherein R20, R40, and R70 are reflectances (%) of a P-wave incident at angles of 20°, 40°, and 70°, respectively, to the normal to the film surface, the laminate film has high reflection performance to light incident on the film surface obliquely. Therefore, it is possible to provide a display device excellent in visibility of information that is projected using a light source that emits light incident on the laminate film at an angle of 40° or more. It is more preferable that the display device include a light source that emits light incident on the laminate film at an angle of 60° or more to the normal to the film surface, and it is still more preferable that the display device include a light source that emits light incident on the laminate film at an angle of 70° or more to the normal to the film surface. The larger the incident angle to the laminate film is, the higher the reflectance is, so that the displayability is improved.

A specific example of the display device is a head-up display. In the head-up display, information is projected from a small projector to a windshield of an automobile or a prompter made of a transparent substrate and provided in the vicinity of the windshield. Use of the laminate film of the present invention in a windshield or a prompter makes it possible to display information clearly and with high reproducibility while maintaining the transparency in the front direction. In this case, the laminate film may be bonded to the windshield with an adhesive, or may be inserted inside the laminated glass used in the windshield. In addition, the prompter may also be bonded to a transparent substrate.

A preferred aspect of the present invention is a display device including the laminate film, and a light source that emits light to the laminate film, the light source having an emission band in a wavelength range of 400 to 700 nm, the display device satisfying a relationship of R1>R2, wherein R1 is incident light distribution of light incident from the light source on the laminate film, and R2 is emitted light distribution of light incident from the light source on the laminate film and emitted from the laminate film. Herein, the incident light distribution and the reflected light distribution each refer to an angle range in which, when an optical receiver is provided in a variable angle unit capable of changing the light receiving angle in the range of −90° to 90°, and the maximum intensity in the light receiving angle range of −90° to 90° is defined as 100%, the intensity is 50% or more. The smaller the value is, it means that light is condensed in the direction perpendicular to the film surface, and that a display device satisfying the relationship of R1>R2 includes a laminate film having a function of condensing transmitted light. Further, the light incident from the light source on the laminate film is not necessarily limited to the light directly incident from the light source on the laminate film, and also includes light incident on the laminate film via other optical members such as a diffusion sheet, a diffusion film, and a prism sheet. The incident light distribution of the light incident on the laminate film substantially coincides with the emitted light distribution of the light emitted from the light source or the optical member provided immediately below the laminate film. In the laminate film according to an embodiment of the present invention, the laminate film has a transmittance of light incident perpendicularly to a film surface of 70% or more, the laminate film satisfies a relationship of R20≤R40<R70, wherein R20, R40, and R70 are reflectances of a P-wave incident at angles of 20°, 40°, and 70°, respectively, to the normal to the film surface, and the reflectance of R70 is 30% or more. Therefore, the film transmits light in the direction perpendicular to the film surface and reflects light oblique to the film surface, so that light incident on the film surface can be condensed in the direction perpendicular to the film surface. As a result, use of the laminate film of the present invention can easily improve the brightness of a display device in the front direction, and the laminate film can be suitably used in general liquid crystal displays in addition to the transparent substrate used in a HUD or a HMD. R2 is more preferably 120° or less, still more preferably 80° or less. Such a range of R2 can be easily achieved by increasing the reflectance for the light incident on the film surface of the laminate film obliquely.

Specifically, a configuration example in the case where the laminate film of the present invention is included in a liquid crystal display will be described. In the case of a direct backlight liquid crystal display in which the light source is provided below the display, the laminate film may be provided at any place between the light source and a liquid crystal module. The laminate film is particularly preferably provided on a diffusion plate provided at a distance from the light source or on a diffusion film provided on the diffusion plate. The combination of the laminate film of the present invention with a diffusing member makes it possible to suppress uneven brightness, which is often a problem in backlights, by the diffusion film, and to further suppress light scattering, which is a defect of the diffusion film, by the laminate film. Therefore, it is possible to improve the front brightness while suppressing unevenness in brightness and color.

It is also preferable that the laminate film of the present invention be combined with an optical member having a prism shape or a lens shape formed on the surface. An optical member having a prism shape or a lens shape on the surface has excellent light-harvesting properties, but has a problem of slight light leakage in an oblique direction other than the desired light-harvesting direction. However, the combination of the optical member and the laminate film of the present invention can strongly block oblique light and can also exhibit excellent light-harvesting properties, and is particularly useful for improving the brightness of a liquid crystal display.

Further, the laminate film of the present invention is also preferably combined with an optical member having polarized reflection performance. Although the laminate film of the present invention is excellent in providing light-harvesting properties and transparency in the front direction, its function of controlling the polarization state is insufficient for use in a display device. Therefore, use of the laminate film in combination with an optical member having polarized light reflection properties makes it possible to control the polarization state and to provide a display device excellent in displayability.

As described above, it is also preferable that the display device including the laminate film of the present invention further include, in addition to the laminate film, an optical member that changes the emitted light distribution and/or the polarization state of light in combination. Herein, the wording "change the emitted light distribution of light" means that the light-harvesting properties, the diffusion properties, and the visibility are changed. Further, the wording "a member that changes the polarization state of light" means a member that changes the ratio between the P polarization and the S polarization of transmitted light. When the laminate film is used in combination with a film having such optical functions, optical functions other than permeability in the direction perpendicular to the film surface and oblique reflection properties are imparted to the display device, and the laminate film can be suitably used in general liquid crystal displays in addition to the transparent substrate used in a HUD or a HMD.

Further, the laminate film of the present invention is used as a viewing angle control member used for peek prevention of displays such as personal computers as well as a sensor member. In general, an optical member in which transparent members and colored members are alternately arranged is used in order to control the viewing angle in displays for peek prevention. The optical member, however, has a problem that when viewed from a direction perpendicular to the optical member, the optical member has deteriorated light permeability due to the colored members. Therefore, combination use of the optical member with the laminate film of the present invention excellent in transparency in the direction perpendicular to the film surface can easily provide a display device having excellent peek prevention properties and viewing angle controllability while maintaining high transparency in the direction perpendicular to the film surface. It is also preferable to use the laminate film in combination with an optical member in which transparent members and colored members are alternately arranged. The laminate film of the present invention is excellent in transparency in the front direction, while the reflectance of the laminate film when viewed obliquely gradually increases. Therefore, it is impossible to sharply control the visibility at a specific viewing angle. Therefore, use of the laminate film in combination with an optical member in which transparent members and colored members are alternately arranged makes it possible to achieve both the front permeability and the sharp viewing angle controllability at a specific angle.

EXAMPLES

Hereinafter, the laminate film of the present invention will be described with reference to examples.

[Method for Measuring Physical Properties and Method for Evaluating Effects]

The method for evaluating characteristic values and the method for evaluating effects are as follows.

(1) Number of Laminated Layers:

The layer structure of a laminate film was determined by observing a sample, a cross section of which was obtained by cutting using a microtome, with a transmission electron microscope (TEM). Specifically, using a transmission electron microscope model H-7100FA (manufactured by Hitachi, Ltd.), a cross-sectional photograph of the film was taken under the condition of an accelerating voltage of 75 kV to examine the number of layers.

(2) Reflectance, Transmittance, and Saturation of Laminate Film:

A variable angle transmission accessory and a polarizer manufactured by Glan-Taylor were attached to a spectrophotometer (U-4100 Spectrophotomater) manufactured by Hitachi, Ltd., and the transmittance at incident angles of $\varphi=0°$ and 70° and a wavelength of 250 to 1600 nm as well as the reflectance at incident angles of $\varphi=0°$, 40°, and 70° were measured. The measurement conditions were slits of 2 nm (visible)/automatic control (infrared), a gain of 2, and a scanning speed of 600 nm/min. The saturation of the reflected light of the P-wave incident at 70° was calculated as a saturation C* value that was calculated using the reflection spectrum of the P-wave measured at $\varphi=70°$, the spectral distribution of a C light source, and the color-matching function of the XYZ system based on the XYZ values under the C light source, and the XYZ values.

(3) Retardation:

A retardation measurement device (KOBRA-21ADH) manufactured by Oji Scientific Instruments was used. A film sample cut into a size of 3.5 cm×3.5 cm was placed on the device, and the retardation at a wavelength of 590 nm at an incident angle of 0° was measured.

(4) Melting Point, Heat of Crystal Fusion, and Glass Transition Temperature:

A sample was collected from a laminate film to be measured, and the DSC curve of the measurement sample was obtained by measurement according to JIS-K-7122 (1987) using differential scanning calorimetry (DSC). In the test, the temperature was raised from 25° C. to 300° C. at 20° C./min, and the melting point, enthalpy of fusion, and glass transition temperature during the heating were measured. When there were a plurality of glass transition temperatures, the highest glass transition temperature is shown. The device used and the like were as follows.

Device: "EXSTAR DSC6200" manufactured by Seiko Instruments Inc.

Data analysis "Muse Standard Analysis software, version 6.1U"

Mass of sample: 5 mg (5) Incident Light Distribution and Emitted Light Distribution In an edge-type white backlight with a light source provided on the side surface, a white reflective film was provided on the lower surface of a light guide plate, and a diffusion film was provided on the light guide plate. For both the cases with and without the laminate film, the emitted light distribution was measured as for the light receiving angle range of −90° to 90° excluding the light receiving angle range of −15° to 15° using a variable angle unit capable of changing the light receiving angle in the range of −90° to 90° and BM-7 manufacture by TOPCON TECHNOHOUSE CORPORATION as an optical receiver provided on the variable angle unit. Herein, the emitted light distribution in the case where the laminate film was not provided was defined as incident light distribution R1 of the light that is incident on the laminate film, and the emitted light distribution in the case where the laminate film was provided was defined as emitted light distribution R2 of the light incident from the light source on the laminate film and emitted from the laminate film. Further, the range in which the intensity was 50% or more based on the maximum intensity of 100% was defined as the incident light distribution R1 and the emitted light distribution R2, and unless the brightness was below 50%, R1 and R2 were each regarded as the measurement range of 150° regardless of the light receiving angle.

(6) Refractive Index

The refractive indices in the longitudinal direction, the width direction, and the thickness direction of a film were determined using an Abbe refractometer at 25° C. using sodium D-line (wavelength: 589 nm) as a light source and methylene iodide as a mount solution. The average of the refractive indices in the longitudinal direction and the width direction of the film was defined as the refractive index in the direction parallel to the film surface (in-plane average refractive index), and the refractive index in the thickness direction of the film was defined as the refractive index in the direction perpendicular to the film surface.

(7) Molecular Weight of Alkylene Glycol

A film was dissolved in HFIP-d2 (di-deuterated hexafluoro-2-propanol), and subjected to $^1$H NMR measurement. As for the obtained spectrum, the area of the signal having a peak of chemical shift at 3.8 ppm was defined as S1, the area of the signal having a peak of chemical shift at 3.9 ppm was defined as S2, and S1/S2×44 (44: formula weight of the repeating unit of ethylene glycol) was defined as the molecular weight of the alkylene glycol.

Example 1

As the thermoplastic resin A, a copolymer PET (resin 1) having a melting point of 221° C. and a glass transition temperature of 78° C., and containing 88 mol % of terephthalic acid and 12 mol % of isophthalic acid as dicarboxylic acid components and ethylene glycol as a diol component was used. Further, as the thermoplastic resin B, a copolymer PEN (resin 2) as an amorphous resin having no melting point and having a glass transition temperature of 81° C., and containing 70 mol % of 2,6-naphthalenedicarboxylic acid and 30 mol % of isophthalic acid as dicarboxylic acid components and 98 mol % of ethylene glycol and 2 mol % of polyethylene glycol having a molecular weight of 400 as diol components was used. The resin 2 was an amorphous resin and had a refractive index of 1.63.

The prepared thermoplastic resin A and thermoplastic resin B were respectively put into two single-screw extruders, melted at a temperature of 290° C., and kneaded. Then, the thermoplastic resin A and the thermoplastic resin B were each passed through 5 sheets of FSS type leaf disc filters, and then merged with a laminating apparatus having 801 slits while the thermoplastic resins A and B were measured with a gear pump. Thus, a laminate including 801 alternating layers in the thickness direction was obtained. The laminate was formed according to the method described in paragraphs [0053] to [0056] of Japanese Patent Laid-open Publication No. 2007-307893, and the laminating apparatus was an apparatus designed to provide a final product having a reflection band of 400 to 1000 nm.

The obtained cast film was heated with a group of rolls set at a temperature of 60° C., then stretched 3.7 times with a roll set at a temperature of 85° C. in the longitudinal direction of the film, and then cooled once.

The uniaxially stretched film thus obtained was led to a tenter, preheated with hot air of 90° C., and stretched 3.2 times in the film width direction at a temperature of 95° C. The stretched film was directly heat-treated in a tenter with hot air of 240° C., then subjected to a 2% relaxation treatment in the width direction under the same temperature conditions, further rapidly cooled to 100° C., then subjected to a 5% relaxation treatment in the width direction, and then wound up to give a laminate film.

The physical properties of the obtained laminate film are shown in Table 1. Since the difference in refractive index in the direction parallel to the film surface between the thermoplastic resin A and the thermoplastic resin B was 0.00, the film had high transparency in the front direction and had excellent visibility. Moreover, since the difference in refractive index in the direction perpendicular to the film surface was 0.12, the oblique reflectance was high, and the saturation of the reflected light was low, so that the film was excellent in the brightness and color reproducibility of the display of the projected information.

Example 2

A laminate film was obtained in the same manner as in Example 1 except that the draw ratio in the film width direction was 3.6.

The physical properties of the obtained laminate film are shown in Table 1. Since the retardation was slightly larger than that in Example 1 and the difference in refractive index in the direction parallel to the film surface between the thermoplastic resin A and the thermoplastic resin B was 0.01, the film had high transparency in the front direction and had excellent visibility, although the transparency was slightly lower. Moreover, since the difference in refractive index in the direction perpendicular to the film surface was 0.12, the oblique reflectance was high, and the saturation of the reflected light was low, so that the film was excellent in the brightness and color reproducibility of the display of the projected information.

Example 3

A laminate film was obtained in the same manner as in Example 1 except that the draw ratio in the film width direction was 4.0.

The physical properties of the obtained laminate film are shown in Table 1. Since the retardation was slightly larger than that in Example 1 and the difference in refractive index in the direction parallel to the film surface between the thermoplastic resin A and the thermoplastic resin B was 0.02, the film had high transparency in the front direction and had excellent visibility, although the transparency was slightly lower. Moreover, since the difference in refractive index in the direction perpendicular to the film surface was 0.12, the oblique reflectance was high, and the saturation of the reflected light was low, so that the film was excellent in the brightness and color reproducibility of the display of the projected information.

Example 4

A laminate film was obtained in the same manner as in Example 3 except that the draw ratio in the film longitudinal direction was 3.3.

The physical properties of the obtained laminate film are shown in Table 1. Since the retardation was larger than that in Example 1 and the difference in refractive index in the direction parallel to the film surface between the thermoplastic resin A and the thermoplastic resin B was 0.02, the transparency was lower but maintained at a level at which the outside scenery can be visually recognized. Moreover, since the difference in refractive index in the direction perpendicular to the film surface was 0.12, the oblique reflectance was high, and the saturation of the reflected light was low, so that the film was excellent in the brightness and color reproducibility of the display of the projected information.

Example 5

A laminate film was obtained in the same manner as in Example 1 except that polyethylene terephthalate (resin 3) having a melting point of 254° C. and a glass transition temperature of 78° C. was used as the thermoplastic resin A.

The physical properties of the obtained laminate film are shown in Table 1. Reflecting that the refractive index of the thermoplastic resin A in the direction parallel to the film surface was higher than that in Example 1 and the difference in refractive index in the direction parallel to the film surface between the thermoplastic resin A and the thermoplastic resin B was larger and 0.03, the transparency was lower but maintained at a level at which the outside scenery can be visually recognized. Meanwhile, reflecting that the refractive index of the thermoplastic resin A in the direction perpendicular to the film surface was lower and the difference in refractive index in the direction perpendicular to the film surface between the thermoplastic resin A and the thermoplastic resin B was larger and 0.14, the oblique reflectance was high, so that the film was excellent in the brightness of the display of information, but was slightly lower in the color reproducibility due to some coloring although the film was usable.

Example 6

A laminate film was obtained in the same manner as in Example 1 except that as the thermoplastic resin B, a copolymer PET (resin 4) as an amorphous resin having no melting point and having a glass transition temperature of 95° C., and containing 70 mol % of terephthalic acid and 30 mol % of 2,6-naphthalenedicarboxylic acid as dicarboxylic acid components and 100 mol % of ethylene glycol as a diol component was used. The resin 4 was an amorphous resin and had a refractive index of 1.60.

The physical properties of the obtained laminate film are shown in Table 1. Reflecting that the refractive index of the thermoplastic resin B in the direction parallel to the film surface was lower than that in Example 1 and the difference in refractive index in the direction parallel to the film surface between the thermoplastic resin A and the thermoplastic resin B was larger and 0.03, the film had high transparency in the front direction and had excellent visibility, although the transparency was slightly lower. Moreover, since the difference in refractive index in the direction perpendicular to the film surface was 0.08, the oblique reflectance was slightly lower, but the saturation of the reflected light was also low, so that the film was excellent in the color reproducibility of the projected information.

Example 7

A laminate film was obtained in the same manner as in Example 5 except that as the thermoplastic resin A, a copolymer PET (resin 5) having a melting point of 215° C. and a glass transition temperature of 77° C., and containing 82 mol % of terephthalic acid and 18 mol % of isophthalic acid as dicarboxylic acid components and 100 mol % of ethylene glycol as a diol component was used.

The physical properties of the obtained laminate film are shown in Table 1. Reflecting that the refractive index of the thermoplastic resin A in the direction parallel to the film surface was lower than that in Example 5 and the difference in refractive index in the direction parallel to the film surface between the thermoplastic resin A and the thermoplastic resin B was smaller and 0.01, the film was excellent in transparency so that the outside scenery can be visually recognized. Meanwhile, reflecting that the refractive index of the thermoplastic resin A in the direction perpendicular to the film surface was larger and the difference in refractive index in the direction perpendicular to the film surface between the thermoplastic resin A and the thermoplastic resin B was smaller and 0.05, the oblique reflectance was slightly low, but it was possible to view the projected information.

Example 8

A laminate film was obtained in the same manner as in Example 5 except that as the thermoplastic resin B, a copolymer PEN (resin 6) as an amorphous resin having no melting point and having a glass transition temperature of 91° C., and containing 80 mol % of 2,6-naphthalenedicarboxylic acid and 20 mol % of isophthalic acid as dicarboxylic acid components and 96 mol % of ethylene glycol and 4 mol % of polyethylene glycol having a molecular weight of 400 as diol components was used. The resin 6 was an amorphous resin and had a refractive index of 1.64.

The physical properties of the obtained laminate film are shown in Table 1. Reflecting that the refractive index of the thermoplastic resin B in the direction parallel to the film surface was higher than that in Example 5 and the difference in refractive index between the thermoplastic resin A and the thermoplastic resin B was smaller and 0.02, the film was excellent in transparency so that the outside scenery can be visually recognized. In addition, reflecting that the difference in refractive index in the direction perpendicular to the film surface between the thermoplastic resin A and the thermoplastic resin B was larger and 0.13, the oblique reflectance was also improved, and the film was excellent in the visibility of projected information.

Example 9

A laminate film was obtained in the same manner as in Example 8 except that as the thermoplastic resin B, a copolymer PEN (resin 7) as an amorphous resin having no melting point and having a glass transition temperature of 93° C., and containing 80 mol % of 2,6-naphthalenedicarboxylic acid and 20 mol % of isophthalic acid as dicarboxylic acid components and 92 mol % of ethylene glycol and 8 mol % of polyethylene glycol having a molecular weight of 190 as diol components was used. The resin 7 was an amorphous resin and had a refractive index of 1.64.

The physical properties of the obtained laminate film are shown in Table 1. There was no significant difference in the visibility of the outside scenery and the visibility of the projected information as compared with Example 8. However, reflecting the difference in the glass transition temperature, slight thickness unevenness was observed.

Example 10

Two laminate films obtained in Example 1 were bonded together with a pressure-sensitive adhesive to produce a laminate film including 1603 layers.

The physical properties of the obtained laminate film are shown in Table 1. The film had high transparency in the front direction and was excellent in visibility, and was more excellent in oblique reflection performance than in Example 1 due to the increased number of layers.

Example 11

A laminate film was obtained in the same manner as in Example 1 except that a laminating apparatus designed to provide a total number of layers of 401 and a reflection band of 400 to 800 nm was used.

The physical properties of the obtained laminate film are shown in Table 1. The film had high transparency in the front direction and was excellent in visibility, but was slightly lower in oblique reflection performance than in Example 1 due to the decreased number of layers. However, it was possible to view the projected information.

Example 12

A laminate film was obtained in the same manner as in Example 3 except that a laminating apparatus designed to provide a total number of layers of 201 and a reflection band of 400 to 800 nm was used.

The physical properties of the obtained laminate film are shown in Table 1. The film had high transparency in the front direction and was excellent in visibility, but was slightly lower in oblique reflection performance than in Example 3 due to the decreased number of layers. However, it was possible to view the projected information.

Comparative Example 1

A laminate film was obtained in the same manner as in claim 1 except that a single-layer film made of the resin 3 was used and no laminating apparatus was used.

The physical properties of the obtained film are shown in Table 1. The film had high transparency in the front direction and was excellent in visibility, but had no oblique reflection properties since it was a single-layer film, and it was impossible to view the projected information.

Comparative Example 2

A laminate film was obtained in the same manner as in Example 1 except that as the thermoplastic resin B, a copolymer PET (resin 8) as an amorphous resin having no melting point and having a glass transition temperature of 78° C., and containing 100 mol % of terephthalic acid as a dicarboxylic acid component and 68 mol % of ethylene glycol and 32 mol % of cyclohexanedimethanol as diol components was used. The resin 8 had a refractive index of 1.57.

The physical properties of the obtained laminate film are shown in Table 1. Compared to Example 1, since the difference in refractive index in the direction parallel to the film surface between the thermoplastic resin A and the thermoplastic resin B was 0.10, the reflection performance in the front direction was high, and it was impossible to visually recognize the scenery.

Comparative Example 3

A laminate film was obtained in the same manner as in Example 7 except that a laminating apparatus designed to provide a total number of layers of 401 and a reflection band of 400 to 800 nm was used.

The physical properties of the obtained laminate film are shown in Table 1. The film had high transparency in the front direction and was excellent in visibility, but was low in oblique reflection performance, and it was sometimes impossible to view the projected information. Therefore, the laminate film was unsuitable for use in HUDs and HMDs.

Comparative Example 4

A laminate film was obtained in the same manner as in Example 7 except that a laminating apparatus designed to provide a total number of layers of 401 and a reflection band of 580 to 620 nm was used.

The physical properties of the obtained laminate film are shown in Table 1. The film had high transparency in the front direction and was excellent in visibility, but was high in saturation and reflected only specific colors. Therefore, the laminate film had low full color information displayability, and was unsuitable for use in HUDs and HMDs.

Example 11

The laminate film obtained in Example 1 was provided on an edge-type backlight, and the emitted light distribution was measured with and without the laminate film. As a result, when the laminate film was not used, the emitted light distribution was almost uniform regardless of the light receiving angle (R1=150°). In contrast, when the laminate film was used, the light was condensed in the direction perpendicular to the film surface, the intensity of the emitted light at the front was 1.8 times, and R2 was 100°.

TABLE 1A

| | | | Example 1 | Example 2 | Example 3 | Example 4 | Example 5 | Example 6 | Example 7 | Example 8 |
|---|---|---|---|---|---|---|---|---|---|---|
| Resin | Thermoplastic resin A | — | Resin 1 | Resin 1 | Resin 1 | Resin 1 | Resin 3 | Resin 1 | Resin 5 | Resin 1 |
| | Thermoplastic resin B | — | Resin 2 | Resin 2 | Resin 2 | Resin 2 | Resin 2 | Resin 4 | Resin 4 | Resin 6 |
| Number of layers | | — | 801 | 801 | 801 | 801 | 801 | 801 | 801 | 801 |
| Reflectance | 20° | % | 9 | 12 | 17 | 18 | 24 | 19 | 13 | 15 |
| | 40° | % | 12 | 19 | 27 | 29 | 39 | 27 | 13 | 41 |
| | 70° | % | 47 | 55 | 62 | 63 | 74 | 57 | 30 | 88 |
| Transmittance | 0° | % | 90 | 88 | 84 | 79 | 76 | 81 | 90 | 85 |
| Standard deviation of transmittance (P-wave) at incident angle of 70° | | % | 4 | 5 | 5 | 4 | 9 | 3 | 2 | 9 |
| Difference between maximum value and minimum value of transmittance (P-wave) at incident angle of 70° | | % | 19 | 20 | 21 | 18 | 38 | 16 | 10 | 31 |
| Saturation of reflected light | 70° | — | 4 | 5 | 7 | 4 | 9 | 3 | 2 | 4 |
| | Retardation | nm | 150 | 960 | 1940 | 2430 | 320 | 210 | 140 | 280 |
| Average refractive index of outermost layer | Direction parallel to film surface | — | 1.63 | 1.64 | 1.65 | 1.65 | 1.66 | 1.63 | 1.61 | 1.66 |
| | Direction perpendicular to film surface | — | 1.51 | 1.51 | 1.51 | 1.51 | 1.49 | 1.51 | 1.55 | 1.49 |
| | Melting point | °C. | 221 | 221 | 221 | 221 | 254 | 221 | 215 | 254 |
| | Enthalpy of fusion | J/g | 32 | 33 | 32 | 32 | 41 | 32 | 30 | 41 |
| Glass transition temperature | Thermoplastic resin A | °C. | 78 | 78 | 78 | 78 | 78 | 78 | 77 | 78 |
| | Thermoplastic resin B | °C. | 81 | 81 | 81 | 81 | 81 | 95 | 95 | 91 |

TABLE 1B

|  |  |  | Example 9 | Example 10 | Example 11 | Example 12 | Comparative Example 1 | Comparative Example 2 | Comparative Example 3 | Comparative Example 4 |
|---|---|---|---|---|---|---|---|---|---|---|
| Resin | Thermoplastic resin A | — | Resin 1 | Resin 1 | Resin 1 | Resin 1 | Resin 3 | Resin 3 | Resin 5 | Resin 5 |
|  | Thermoplastic resin B | — | Resin 7 | Resin 2 | Resin 2 | Resin 2 | Resin 3 | Resin 8 | Resin 4 | Resin 4 |
|  | Number of layers | — | 801 | 1603 | 401 | 201 | 1 | 801 | 401 | 201 |
| Reflectance | 20° | % | 15 | 10 | 10 | 12 | 9 | 56 | 11 | 9 |
|  | 40° | % | 40 | 20 | 10 | 12 | 5 | 64 | 9 | 5 |
|  | 70° | % | 85 | 63 | 37 | 32 | 4 | 84 | 21 | 10 |
| Transmittance | 0° | % | 85 | 90 | 91 | 87 | 91 | 47 | 91 | 91 |
| Standard deviation of transmittance (P-wave) at incident angle of 70° |  | % | 9 | 4 | 1 | 4 | 1 | 4 | 1 | 14 |
| Difference between maximum value and minimum value of transmittance (P-wave) at incident angle of 70° |  | % | 29 | 19 | 6 | 19 | 3 | 19 | 5 | 53 |
| Saturation of reflected light | 70° | — | 4 | 5 | 1 | 1 | 0 | 2 | 1 | 22 |
|  | Retardation | nm | 310 | 350 | 110 | 780 | 310 | 1930 | 120 | 90 |
| Average refractive index of outermost layer | Direction parallel to film surface | — | 1.66 | 1.63 | 1.63 | 1.65 | 1.66 | 1.67 | 1.61 | 1.61 |
|  | Direction perpendicular to film surface | — | 1.49 | 1.51 | 1.51 | 1.51 | 1.49 | 1.49 | 1.55 | 1.55 |
|  | Melting point | °C. | 254 | 221 | 221 | 221 | 256 | 256 | 215 | 215 |
|  | Enthalpy of fusion | J/g | 40 | 31 | 34 | 35 | 50 | 37 | 31 | 32 |
| Glass transition temperature | Thermoplastic resin A | °C. | 78 | 78 | 78 | 78 | 78 | 78 | 77 | 77 |
|  | Thermoplastic resin B | °C. | 93 | 81 | 81 | 81 | — | 78 | 95 | 81 |

INDUSTRIAL APPLICABILITY

In the present invention, the laminate film is excellent in the transparency in the front direction and the reflection properties of the obliquely projected image. The laminate film of the present invention is suitable for applications in which visibility of external information in the front direction and visibility of information from an oblique direction as well as properties of blocking information from an oblique direction are required. The laminate film can be suitably used as a transparent display substrate for head-up displays and head mounted displays, a condensing substrate for liquid crystal displays, and a peek prevention film for personal computers and the like.

The invention claimed is:

1. A laminate film comprising a laminate of 50 or more layers of a plurality of different thermoplastic resins,
the laminate film having a transmittance of light incident perpendicularly to a film surface of 50% or more,
the laminate film satisfying a relationship of R20≤R40<R70, wherein R20, R40, and R70 are reflectances (%) of a P-wave, a P-polarized light, incident at angles of 20°, 40°, and 70°, respectively, to a normal to the film surface,
the reflectance of R70 being 30% or more,
reflected light of the P-wave incident at the angle of 70° to the normal to the film surface having a saturation C* value under the color-matching function of XYZ system of 20 or less,
wherein the laminate film contains two thermoplastic resins,
i. a resin that constitutes a layer A containing a first thermoplastic resin containing a crystalline polyester,
ii. a resin that constitutes a layer B containing a second thermoplastic resin which is an amorphous polyester,
iii. a difference in in-plane refractive index between the layer A and the layer B is 0.04 or less, and a difference in glass transition temperature between the layer A and the layer B is 20° C. or less,
wherein the second thermoplastic resin that constitutes the layer B includes a structure derived from an alkylene glycol having a number average molecular weight of 200 or more, and
wherein a standard deviation of a transmittance of the P-wave incident at the angle of 70° to the normal to the film surface in a wavelength range of 450 to 650 nm is 10% or less.

2. The laminate film according to claim 1, having an in-plane retardation of 2000 nm or less.

3. The laminate film according to claim 1, wherein a difference between a maximum value and a minimum value of the reflectance of the P-wave incident at the angle of 70° to the normal to the film surface in a wavelength range of 450 to 650 nm is less than 40%.

4. The laminate film according to claim 1, having one melting point and having an enthalpy of fusion of 20 J/g or more.

5. The laminate film according to claim 1, wherein an outermost layer of the laminate film has an in-plane average refractive index of 1.61 or more, and the laminate film has a glass transition temperature of 90° C. or less.

6. The laminate film according to claim 1, wherein the plurality of different thermoplastic resins are alternately laminated.

7. A display device comprising:
the laminate film according to claim 1; and
a light source that emits light incident on the laminate film at an angle of 40° or more to the normal to the film surface.

8. A display device comprising:
the laminate film according to claim 1; and
a light source that emits light to the laminate film,
the light source having an emission band in a wavelength range of 400 to 700 nm, the display device satisfying a relationship of R1>R2, wherein R1 is incident light distribution of light incident from the light source on the laminate film, and R2 is emitted light distribution of light incident from the light source on the laminate film and emitted from the laminate film.

9. The display device according to claim 7, further comprising at least one optical member selected from an optical member that changes emitted light distribution of light incident from the light source on the laminate film and emitted from the laminate film, and an optical member that changes a polarization state of light incident from the light source on the laminate film and emitted from the laminate film.

10. The display device according to claim 9, wherein the optical member has, on a surface thereof, a plurality of convex portions having a prism shape or a lens shape.

11. The display device according to claim 9, wherein the optical member includes a transparent member and a colored member that are alternately arranged.

12. The display device according to claim 9, wherein the optical member has polarized reflection performance.

13. The display device according to claim 8, further comprising at least one optical member selected from an optical member that changes emitted light distribution of light incident from the light source on the laminate film and emitted from the laminate film, and an optical member that changes a polarization state of light incident from the light source on the laminate film and emitted from the laminate film.

14. The display device according to claim 13, wherein the optical member has, on a surface thereof, a plurality of convex portions having a prism shape or a lens shape.

15. The display device according to claim 13, wherein the optical member includes a transparent member and a colored member that are alternately arranged.

16. The display device according to claim 13, wherein the optical member has polarized reflection performance.

17. The laminate film according to claim 1, wherein the second thermoplastic resin that constitutes the layer B includes a structure derived from two or more aromatic dicarboxylic acids and two or more alkyl diols, and includes at least a structure derived from an alkylene glycol having a number average molecular weight of 200 or more.

* * * * *